United States Patent [19]
Iino et al.

[11] Patent Number: 5,568,054
[45] Date of Patent: Oct. 22, 1996

[54] PROBE APPARATUS HAVING BURN-IN TEST FUNCTION

[75] Inventors: Shinji Iino; Itaru Iida, both of Yamanashi-ken, Japan

[73] Assignees: Tokyo Electron Limited, Tokyo; Tokyo Electron Yamanashi Limited, Yamanashi, both of Japan

[21] Appl. No.: 444,888

[22] Filed: May 19, 1995

Related U.S. Application Data

[63] Continuation of Ser. No. 99,327, Jul. 30, 1993, abandoned.

[30] Foreign Application Priority Data

Jul. 31, 1992 [JP] Japan .................... 4-225097

[51] Int. Cl.⁶ .................................. G01R 31/02
[52] U.S. Cl. .................. 324/760; 324/756; 324/755; 324/537; 324/754
[58] Field of Search .................. 324/755, 756, 324/760, 537, 754

[56] References Cited

U.S. PATENT DOCUMENTS

| | | | |
|---|---|---|---|
| 3,842,346 | 10/1974 | Bobbitt | 324/537 |
| 4,845,426 | 7/1989 | Nolan et al. | 324/760 |
| 5,159,274 | 10/1992 | Lieux et al. | 324/756 |
| 5,198,752 | 3/1993 | Miyata et al. | 324/760 |
| 5,266,889 | 11/1993 | Harwood et al. | 324/754 |
| 5,325,052 | 6/1994 | Yamashita | 324/760 |

FOREIGN PATENT DOCUMENTS 62-221126  9/1987  Japan .

Primary Examiner—Kenneth A. Wieder
Assistant Examiner—Kourosh Cyrus Khosravi
Attorney, Agent, or Firm—Oblon, Spivak, McClelland, Maier & Neustadt, P.C.

[57] ABSTRACT

A probe apparatus having a burn-in test function includes an apparatus body, a probe card, having a plurality of probes, for causing the plurality of probes to electrically contact a semiconductor wafer, a tester for measuring the electrical characteristics of the semiconductor wafer, heating and cooling mechanisms for applying a thermal stress to test target chips, as targets of the burn-in test, of the semiconductor wafer, and an electrical mechanism for applying an electrical stress to the chips.

22 Claims, 9 Drawing Sheets

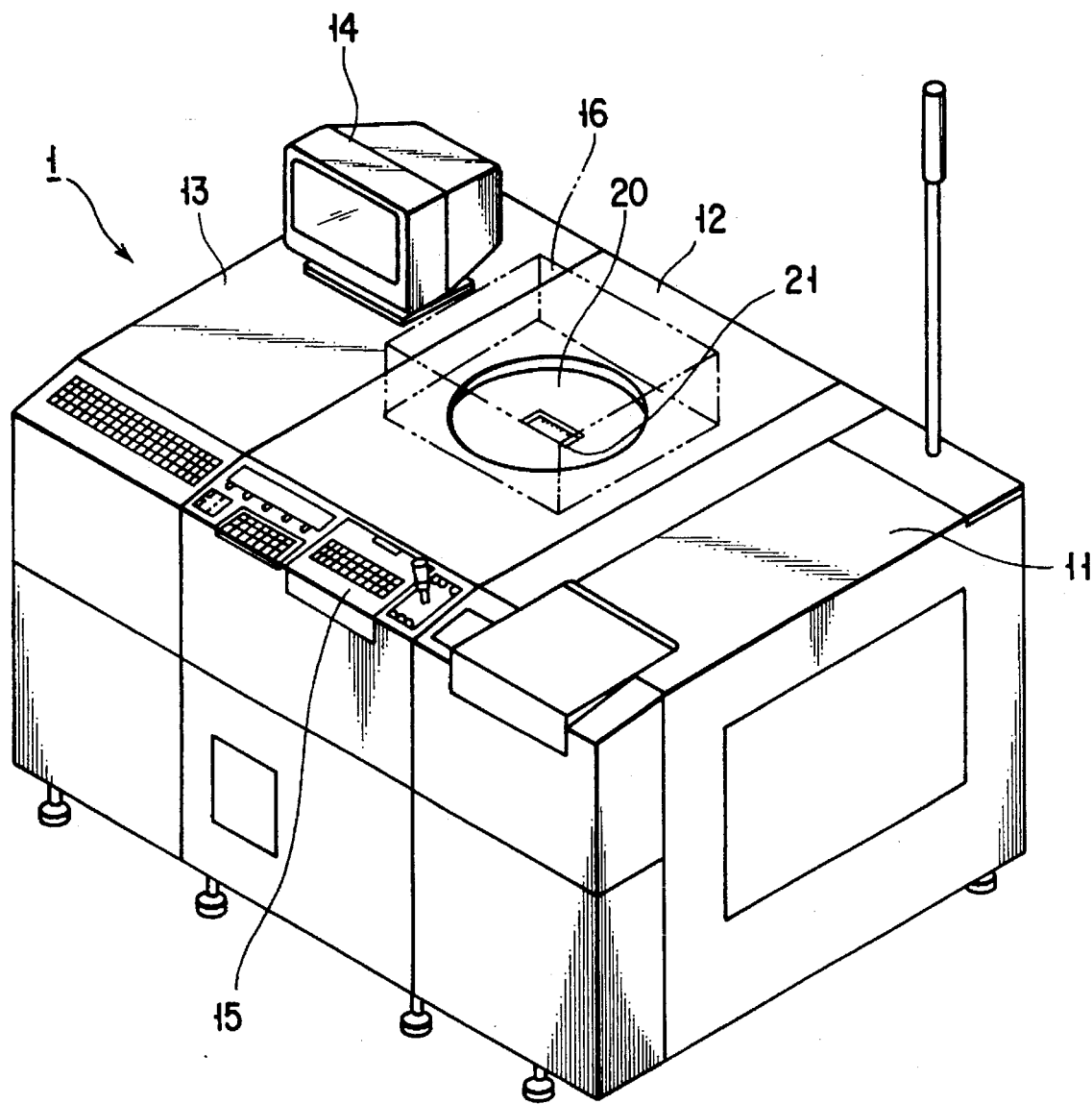
F I G. 1

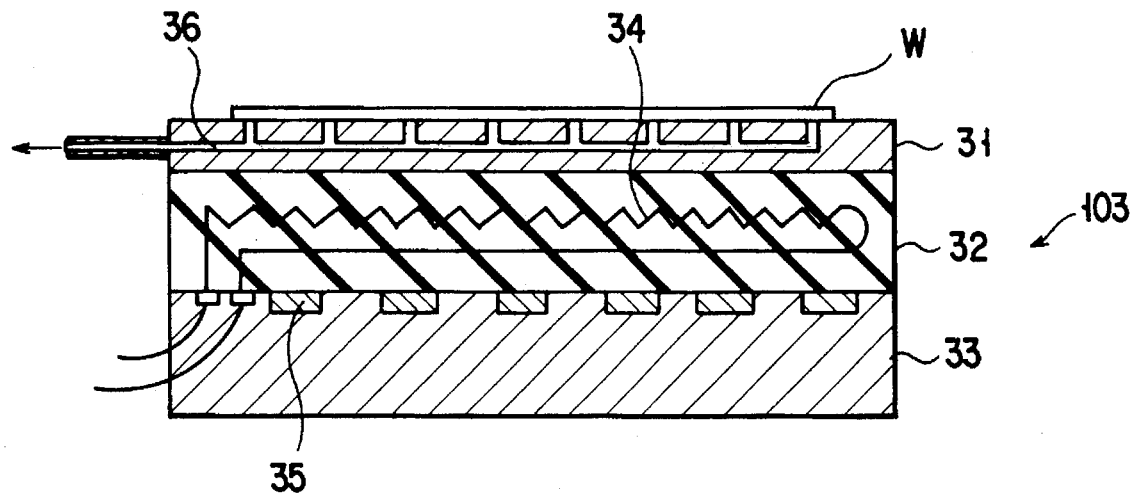
F I G. 4
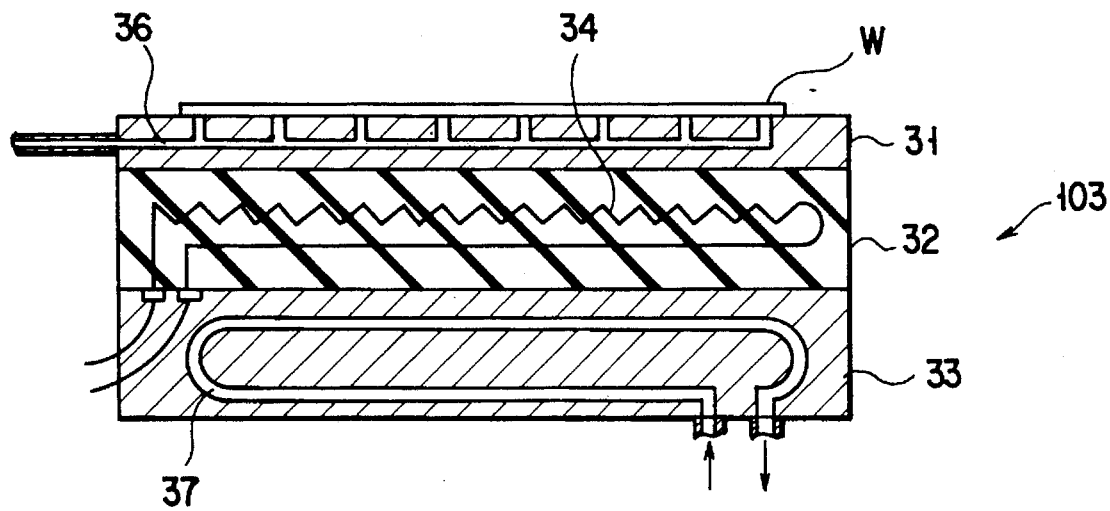
F I G. 5

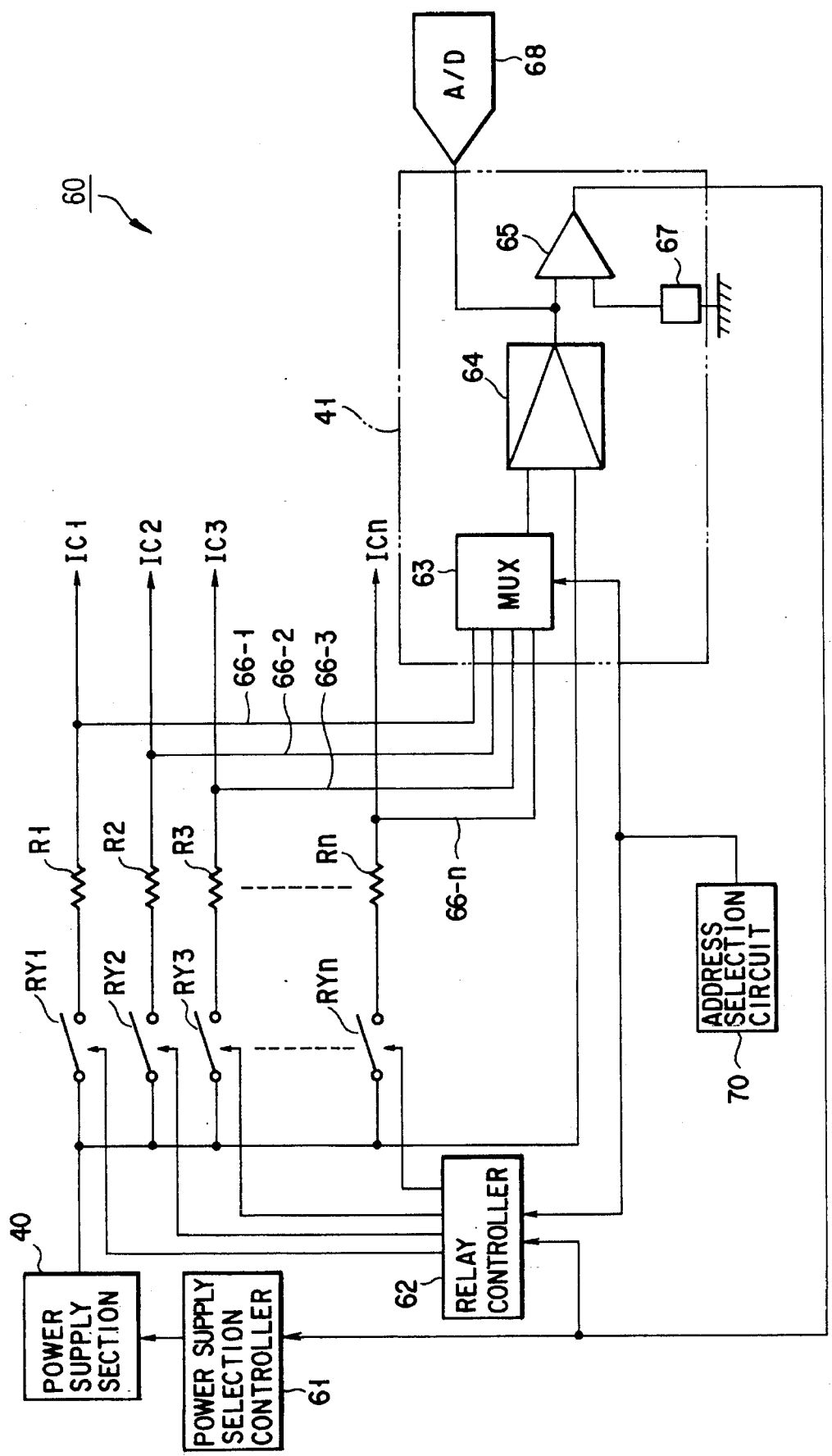
F I G. 8

PROBE APPARATUS HAVING BURN-IN TEST FUNCTION

This application is a continuation of application Ser. No. 08/099,327, filed on 7/30/93, now abandoned.

BACKGROUND OF THE INVENTION

1. Field of the Invention

The present invention relates to a probe apparatus having a burn-in test function for performing thermal and electrical screening of a semiconductor wafer.

2. Description of the Related Art

Integrated circuit (IC) chips are formed on a semiconductor conductor wafer by processes, e.g., film deposition, and cut and packaged, thereby manufacturing integrated circuits. In this semiconductor device manufacturing process, conventionally, the electrical characteristics of semi-finished semiconductor devices are tested and determined in the state of a semiconductor wafer. Only those determined as non-defective devices as the result of the test and determination are packaged and subjected to the subsequent processes, thereby improving the productivity.

A potential defect is sometimes involved in an IC chip due to a film deposition defect during the process. After such an IC chip is packaged, this defect may appear to cause a trouble at a high probability. Therefore, the defect must be caused to appear in advance by accelerating the stress under severe conditions. For this purpose, a stress load test (screening) called a burn-in test is performed.

Conventionally, the burn-in test is performed by mounting a packaged IC chip in a stress loader, heating or cooling the IC chip, applying an overvoltage or an inspection pulse smaller or larger than the rated pulse to the terminals of the IC chip, and measuring, for example, currents flowing in the respective terminals. An idea of performing such a burn-in test by using a probe apparatus has not conventionally existed.

When the burn-in test is to be performed in the manner as described above, the packaged IC chip must be mounted in the stress loader and removed after the test, resulting in a cumbersome operation. Then, the time required for the entire burn-in test process is prolonged, partly interfering with an increase in throughput. Also, an IC chip whose defect becomes apparent at this time point has already been packaged. Even if the defect of this IC chip is small, it is difficult to repair this IC chip.

Furthermore, when the IC chip becomes defective during the burn-in test, short circuiting occurs in the IC chip to flow an overcurrent. Then, the IC chip is burnt and cannot be repaired.

SUMMARY OF THE INVENTION

It is an object of the present invention to provide a probe apparatus having a burn-in function capable of performing a burn-in test of a chip to be tested in a wafer state.

It is another object of the present invention to provide a probe apparatus having a burn-in function capable of preventing burn loss of a chip to be tested when this chip to be inspected on a wafer is subjected to a burn-in test.

According to the first aspect of the present invention, there is provided a probe apparatus having a burn-in test function, comprising: an apparatus body; probe card means, having a plurality of probes, for causing the plurality of probes to electrically contact a plurality of electrodes of a semiconductor chip on a semiconductor wafer; means for measuring electrical characteristics of the semiconductor chip; thermal stress means for applying a thermal stress to the wafer; electrical stress means for applying an electrical stress to a test target chip; and measuring means for measuring an electrical parameter of the chip on the wafer to which a predetermined thermal and/or electrical stress is applied.

According to the second aspect of the present invention, there is provided a probe apparatus having a burn-in test function, comprising: an apparatus body; probe card means, having a plurality of probes, for causing the plurality of probes to electrically contact a plurality of electrodes of a semiconductor chip on a semiconductor wafer; means for measuring electrical characteristics of the semiconductor chip; thermal stress means for applying a thermal stress to the wafer; electrical stress means for applying an electrical stress to a test target chip; power supply means for applying a power supply voltage to the chip on the wafer; measuring means for measuring an electrical parameter of the chip to which a predetermined thermal and/or electrical stress is applied; current monitor means for measuring a current flowing from the power supply means to the burn-in test target chip and outputting a current cutoff signal or a current decrease signal when a current measurement value exceeds a preset value; and current control means for cutting off or decreasing the current flowing in the chip by the current cutoff signal or current decrease signal sent from the current monitor means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, in which:

FIG. 1 is a perspective view showing the outer appearance of a probe apparatus according to an embodiment of the present invention;

FIGS. 4 and 5 are sectional views showing the wafer holding table of the probe apparatus;

FIG. 8 is a circuit diagram showing an arrangement of a power supply monitor section;

DETAILED DESCRIPTION OF THE PREFERRED EMBODIMENT

Figure 2:
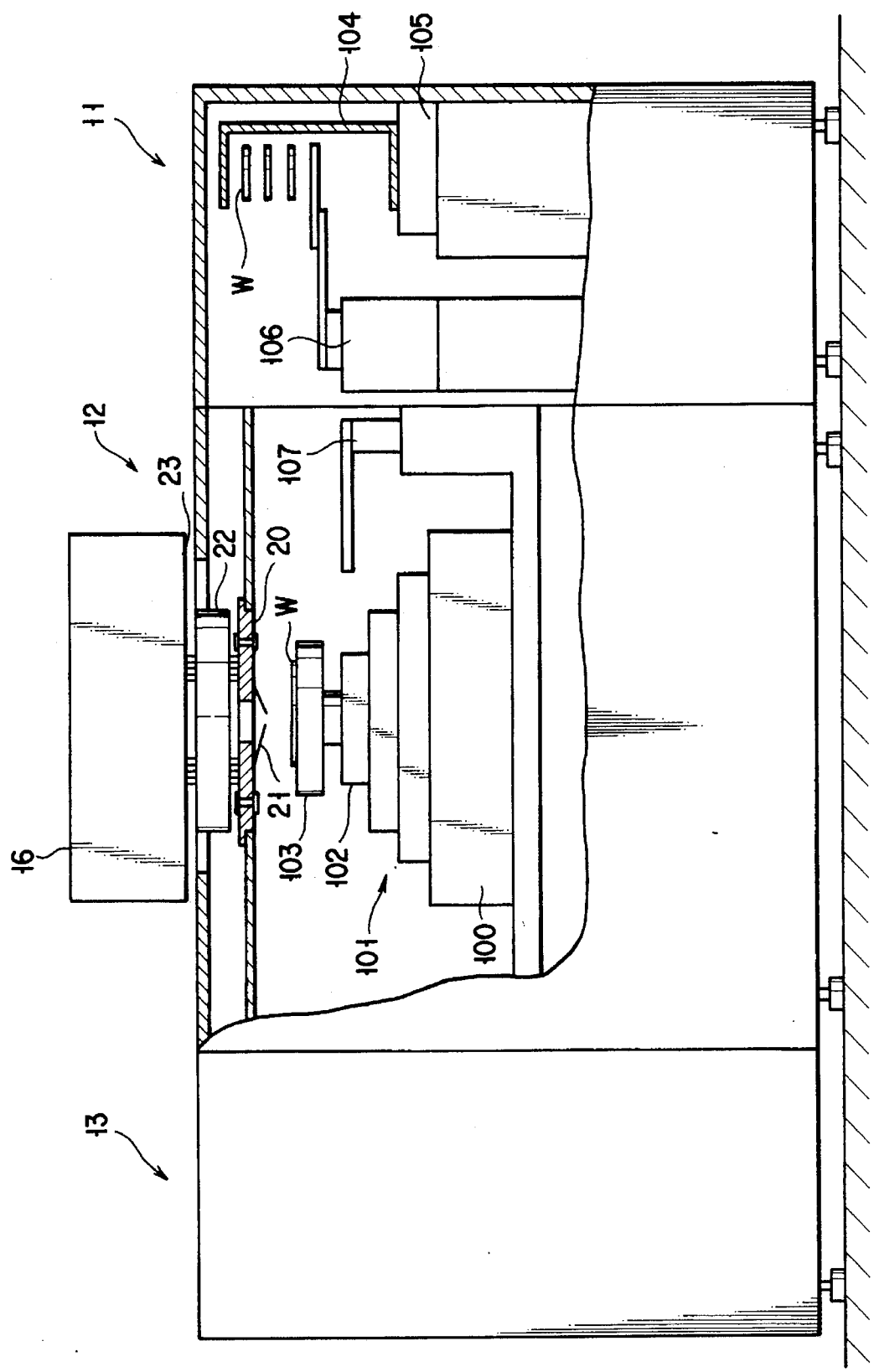
FIG. 2 is a partially cutaway side view of the probe apparatus.

A conventional probe apparatus aims at only measuring the electrical characteristics of a semiconductor wafer and does not have a burn-in test function. However, according to the result of the study of the present inventors, it is also found out that when the burn-in test function is imparted to the probe apparatus, a semiconductor wafer can be subjected to the burn-in test very easily. The present invention is completed based on these findings of the present inventors.

The present invention will be described in detail with reference to the accompanying drawings.

FIG. 1 is a view showing the outer appearance of a probe apparatus having a burn-in test function according to an embodiment of the present invention. This apparatus has a box 1 constituting the housing of the apparatus body, a loading section 11 for loading a semiconductor wafer, an inspection section 12 having a probe card 20 placed on it to perform electrical inspection of a wafer, and a test section 13 incorporating a tester. Reference numeral 14 denotes an aligning CRT camera; and 15, an operation panel. A test head 16 is provided above the inspection section 12 to be openable/closable.

Figure 3:
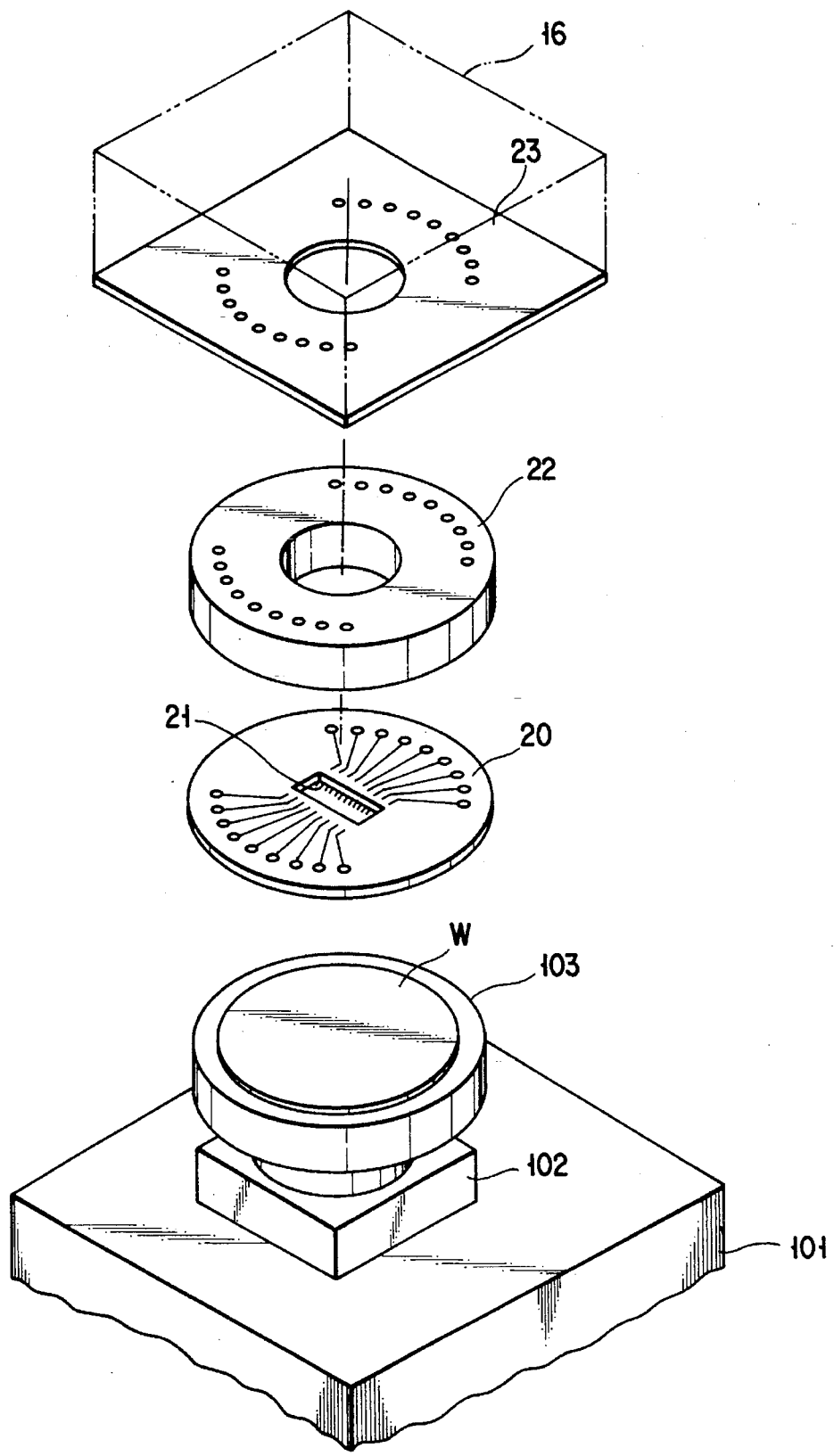
FIG. 3 is a perspective view for explaining the arrangement of the major portions of the inspection section of the probe apparatus.

The interior of the probe apparatus will be described with reference to FIGS. 2 and 3. FIG. 2 is a partially cutaway side view of this probe apparatus, and FIG. 3 is a perspective view for explaining the arrangement of the major portions of the inspection section 12.

A main stage 100 is provided at substantially the center of the inspection section 12, and an X-Y table 101, a Z, θ moving mechanism 102, and a wafer supporting table 103 are sequentially provided on the main stage 100. The wafer supporting table 103 places and fixes a semiconductor wafer thereon. The wafer supporting table 103 can be vertically moved and rotated by the z, θ moving mechanism 102, and can be moved within a horizontal plane by the X-Y table 101.

The probe card 20 is provided above the wafer holding table 103. The probe card 20 has a plurality of probes 21 arranged to correspond to the electrode pads of 44 IC chips so that it can measure, e.g., a maximum of 44 IC chips on a semiconductor wafer W at a time. A contact ring 22 is provided above the probe card 20, and a performance board 23 serving as the bottom of the test head 16 is provided above the contact ring 22. The performance board 23 electrically contacts the probes 21 through the contact ring 22, and wirings for the electrical characteristics test and the burn-in test connect the performance board 23 and the test section 13. Accordingly, the IC chips on the wafer W and the tester in the test section 13 are electrically connected through the probes 21, the contact ring 22, and the performance board 23 by moving the wafer supporting table 103 upward to cause the electrode pads of the IC chips and the probes 21 to contact each other. A board having thereon relays required for the burn-in test (to be described later) is mounted on the performance board 23.

As shown in FIG. 4, the wafer holding table 103 has a metal upper member 31, a ceramic intermediate member 32, and a metal lower member 33. An exhaust path 36 for vacuum suction is concentrically formed in the upper surface of the upper member 31 and connected to a vacuum pump (not shown). When evacuation is performed by the vacuum pump, the wafer w is chucked by the wafer supporting table 103.

A heating resistor 34 is buried in the intermediate member 32 to constitute a ceramic heater as a heating mechanism. When the heating resistor 34 is powered, the semiconductor wafer W above it is heated through the upper member 31. A plurality of Peltier elements 35 serving as a cooling mechanism are arranged at portions of the lower member 33 contacting the intermediate member 32. The wafer W can be cooled by the Peltier elements 35. As the cooling mechanism, as shown in FIG. 5, a coolant path 37 may be formed in the lower member 33 to flow a coolant therein. The Peltier elements 35 and the coolant path 37 may be used at the same time. The heating and cooling mechanisms function as a thermal stress means 30 for applying a thermal stress to the wafer w in the burn-in test (to be described later) (see FIG. 6).

In the loading section 11, a wafer cassette 104 vertically storing a large number of semiconductor wafers w at a predetermined pitch is replaceably arranged on a cassette table 105. A loader stage 106 movable within a horizontal plane and a wafer handling arm 107 that can be driven by a Y-direction driving mechanism and a Z-direction elevating mechanism (neither are shown) are provided between the wafer cassette 104 and the wafer supporting table 103.

The test section 13 can be switched between a test mode for testing the electrical characteristics of an ordinary probe apparatus and a test mode for the burn-in test.

Figure 6:
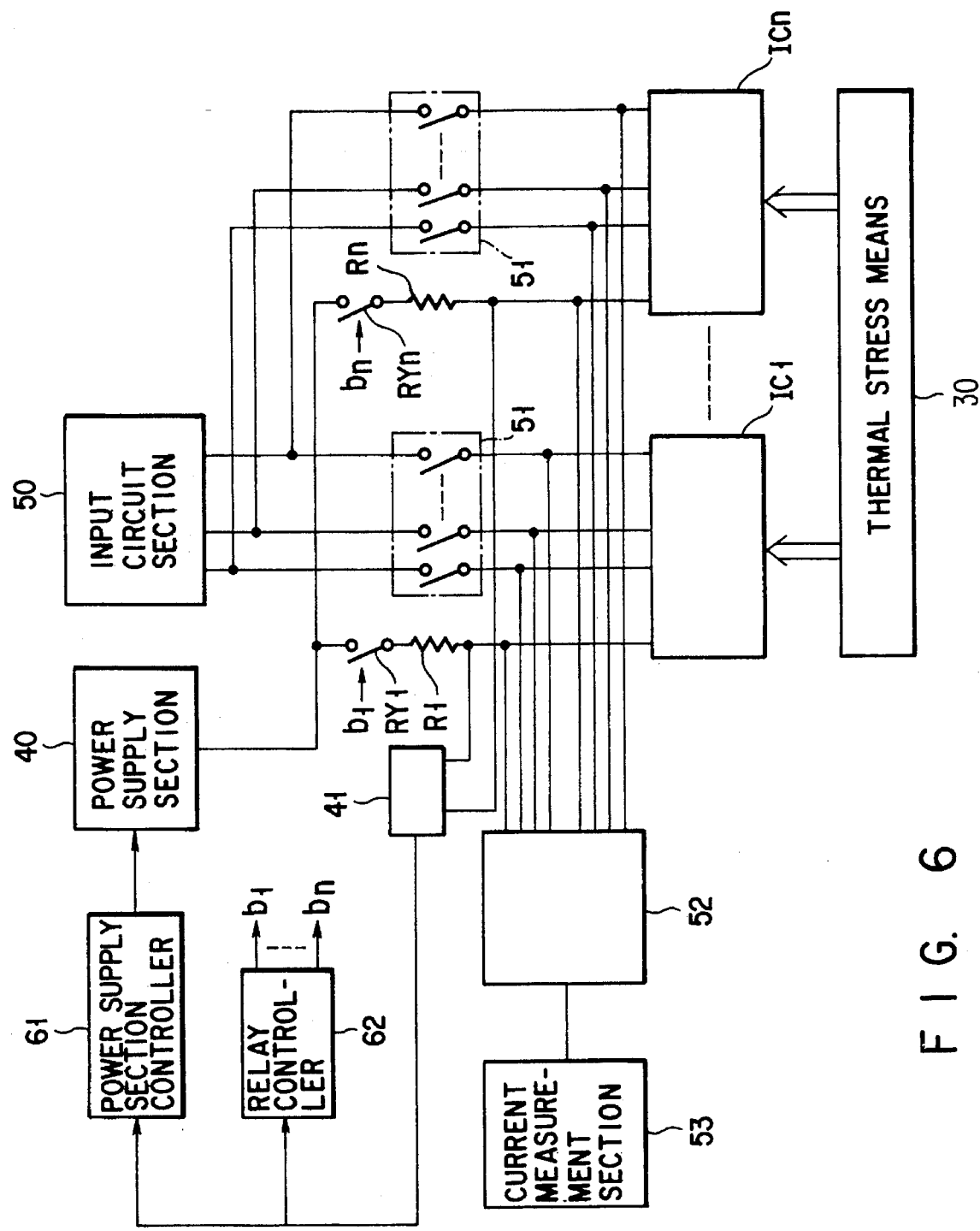
FIG. 6 is a circuit diagram showing an example of the hardware constitution of a circuit used for the burn-in test.

FIGS. 1 to 5 show the hardware constitution of a test circuit used for the burn-in test. FIGS. 6 to 10 are circuit diagrams showing a state wherein the tester for the burn-in test and IC chips on the wafer w are electrically connected through the probes 21. In this embodiment, as shown in FIG. 6, a power supply section 40 and an input circuit section 50 are provided. The power supply section 40 applies a voltage determined by the specifications to $\underline{n}$ IC chips IC1 to ICn. The input circuit section 50 inputs a testing electrical signal to the pins of the ICs in order to apply an electrical stress, e.g., a voltage stress and a pulse stress thereto. The input circuit section 50 can apply various types of pulse widths, frequencies, and voltages. For example, the frequency can be set within the range of 100 kHz to 10 MHz, and the voltage can be set within the range of 0 to 20 V. The input circuit section 50 can apply, e.g., 10-level voltage steps. To apply a voltage to the IC chip IC1, in addition to a voltage determined by the specifications, the power supply section 40 can apply ±50% of this voltage to the chips thereby creating severe conditions. Accordingly, the power supply section 40 constitutes an electrical stress means together with the input circuit section 50.

As described above, the thermal stress means 30 is constituted by the heating and cooling mechanisms incorporated in the wafer supporting table 103, and applies the thermal stress to the IC chips IC1 to ICn. The thermal stress is given within the range of, e.g., room temperature to 180° C., so that not only a simple temperature stress but also a temperature cycle can be applied.

Series circuits of current detection resistors R1 to Rn constituting part of a current monitor section (to be described later) and relays RY1 to RYn constituting breaker sections are connected between the power supply section 40 and the IC chips IC1 to ICn in units of IC chips. The current detection resistors R1 to Rn are connected to a common current measuring section 41.

Relay circuits 51 are connected between the input circuit section 50 and the pins of the ICs. Each relay circuit 51 comprises a plurality of relays for selecting a pin to be connected to the input circuit section 50. A current measurement section 53 is connected to the pins of the IC chips IC1 to ICn through a relay circuit 52 comprising a plurality of relays in order to sequentially measure the current flowing in the pins of the IC chips IC1 to ICn.

The current measuring section 41 is connected to the power supply section controller 61 and the relay controller 62. When the current measurement value measured by the current measuring section 41 exceeds a preset value, the power supply section controller 61 turns off the power supply section 40. When this current measurement value exceeds the preset value, the relay controller 62 outputs a cutoff command to a corresponding relay (either one of the relays RY1 to RYn) in order to disconnect the power supply section 40 from an IC chip (either one of the IC chips IC1 to ICn) in which the current exceeding the preset value flows. In fact, however, all the relays are opened once, and when the power supply section 40 is turned off, relays other than the relay through which an overcurrent flows are closed, so that only the corresponding relay is disconnected. The current measuring section 41, the power supply section controller 61, and the relay controller 62 constitute part of the current monitor section (to be described later).

Figure 7:
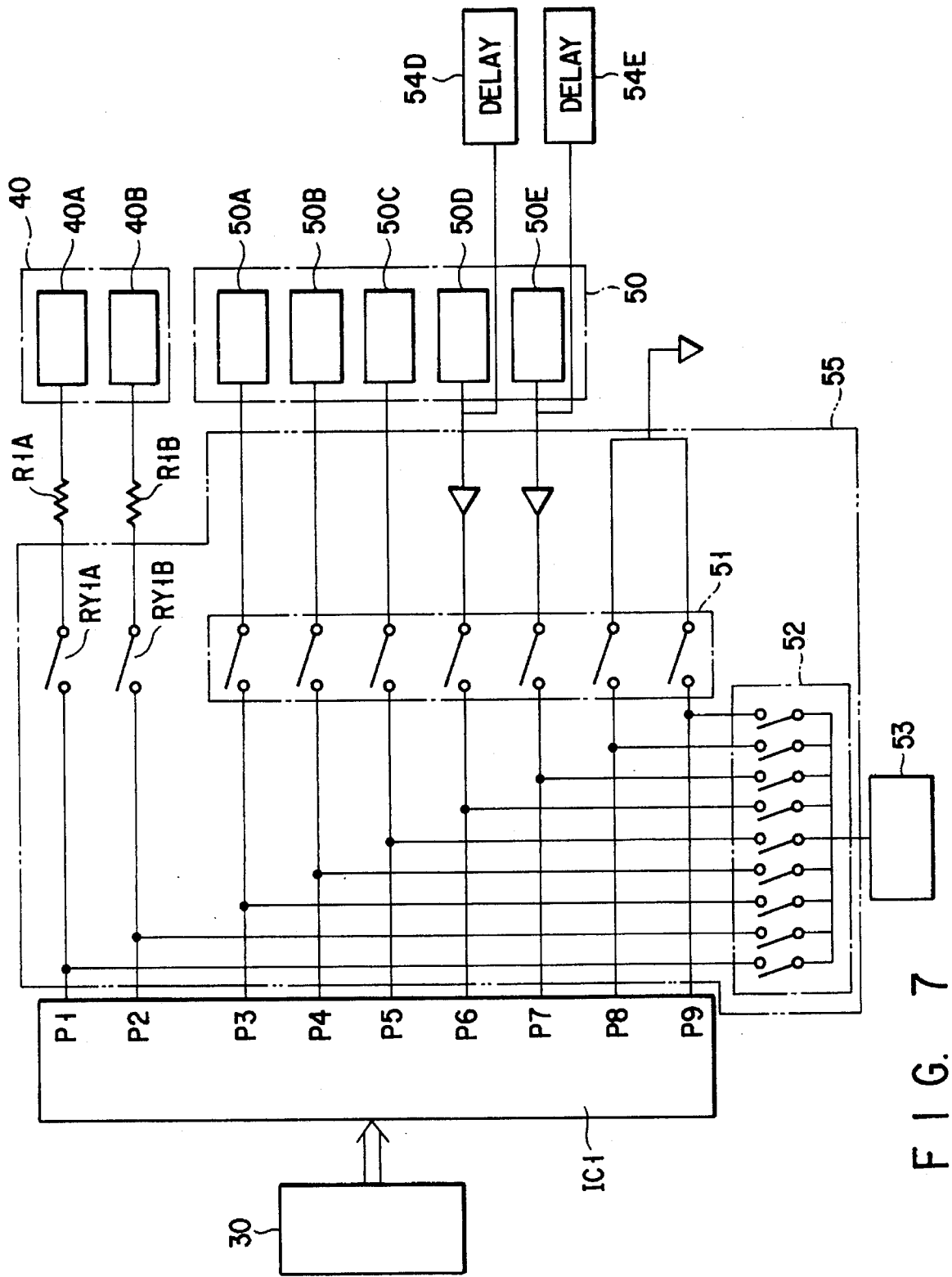
FIG. 7 is a circuit diagram showing connections among an input circuit, a power supply section, and an IC chip.

Connections among the input circuit section 50, the power supply section 40, and the IC chips will be described with reference to FIG. 7 using one IC chip (IC1). In FIG. 7, the IC chip IC1 has nine pins (P1 to P9), and the pins P1 and P2 are respectively connected to power supplies 40A and 40B of the power supply section 40 through relays RY1A and RY1B and current detection resistors R1A and R1B. The input circuit section 50 has three voltage stress circuits 50A to 50C and two pulse stress circuits 50D and 50E for the IC chip IC1. The voltage stress circuits 50A to 50C apply a DC voltage stress to the pins P3 to P5. The pulse stress circuits 50D and 50E apply to the pins P6 and P7, e.g., an RAS (row address strobe) signal and a CAS (column address signal) in an overlapping manner to fall outside the specifications, thereby performing a severe pulse test. The pins P8 and P9 are grounded. The pulse stress circuits 50D and 50E are connected to delay circuits 54D and 54E. Then, a timing to apply a pulse to the pins of the ICs can be freely set in units of pins, thereby performing a wide-range test.

The current measurement section 53 sequentially receives the current flowing in the pins P1 to P9 and compares it with the preset value, thereby determining whether the IC is defective or not. The defective mode differs depending on the types of defects. For example, when an overcurrent flows or the circuit is open, the corresponding IC is determined as defective.

Of this test circuit for the burn-in test, a relay circuit section 55 indicated by an alternate long and two short dashed line in FIG. 7 is mounted on the performance board 23 described above, and the other portion is housed in the test section 13.

In FIG. 7, the positions of the relays RY1A and RY1B and the current measuring resistors R1A and R1B are opposite to those in FIG. 6 for the sake of illustrative convenience.

A current monitor section 60 will be described in detail with reference to FIG. 8. The current monitor section 60 has the power supply section controller 61, the relay controller 62, the current measuring resistors R1 to Rn, and the common current measuring sections 41 described above. The current measuring resistors R1 to Rn are provided respectively on the power supply lines between the power supply section 40 and the IC chips IC1 to ICn.

The current measuring section 41 has a multiplexer 63 serving as a channel switching section, a differential amplifier 64, and a comparator 65. One input terminal of the differential amplifier 64 is connected to the common terminals of the current detection resistors R1 to Rn, i.e., the terminals on a side connected to the power supply section 40. The terminals of the current measuring resistors R1 to Rn on the other side, e.g., the terminals thereof connected to the IC chips IC1 to ICn, are input to the multiplexer 63 through channels 66-1 to 66-n. The multiplexer 63 sequentially selects the channels 66-1 to 66-n so that the channels 66-1 to 66-n are sequentially input to the other input terminal of the differential amplifier 64. In other words, the voltages across the current measuring resistors R1 to Rn are sequentially input to the differential amplifier 64 and amplified.

The output terminal of the differential amplifier 64 is connected to the comparator 65 for comparing the output voltage of the differential amplifier 64 with the reference voltage of a reference voltage generating section 67. The output terminal of the differential amplifier 64 is connected to an A/D (analog/digital) converter 68 in order to transmit the monitor result of the current, flowing in the IC chips IC1 to ICn from the power supply section 40, to the computer.

The output terminal of the comparator 65 is also connected to the power supply section controller 61 and the relay controller 62. When the output signal from the comparator 65 is an ON signal, i.e., when the current flowing in the current measuring resistors R1 to Rn exceeds the preset value (this preset value is determined by the reference voltage), the power supply section controller 61 turns off the power supply section 40.

When the current exceeds the preset value, the relay controller 62 outputs a cutoff command to a relay concerning an IC chip to which the current as the measurement target flows based on an address signal sent from an address selection circuit 70, and opens this relay, thereby disconnecting the power supply section 40 from this IC chip. As described above, all the relays are opened once, and relays other than the relay through which the overcurrent flows are closed, so that only the corresponding relay is disconnected.

In FIG. 8, the number of power supply sections is one and the number of power supply voltage lines connecting the power supply section to each IC chip is one for the sake of illustrative convenience. However, if a correspondence with the arrangement shown in FIG. 7 is to be obtained, the number of power supply sections is two (40A and 40B in FIG. 7) and the number of power supply voltage lines is two. In this case, when the current exceeds the preset value, the relays (RY1A and RY1B in FIG. 7) of the both power supply voltage lines are opened simultaneously. In FIG. 8, the current flowing in the current measuring resistors R1 to Rn is detected by the differential amplifier 64 and the comparator 65.

Figure 9:
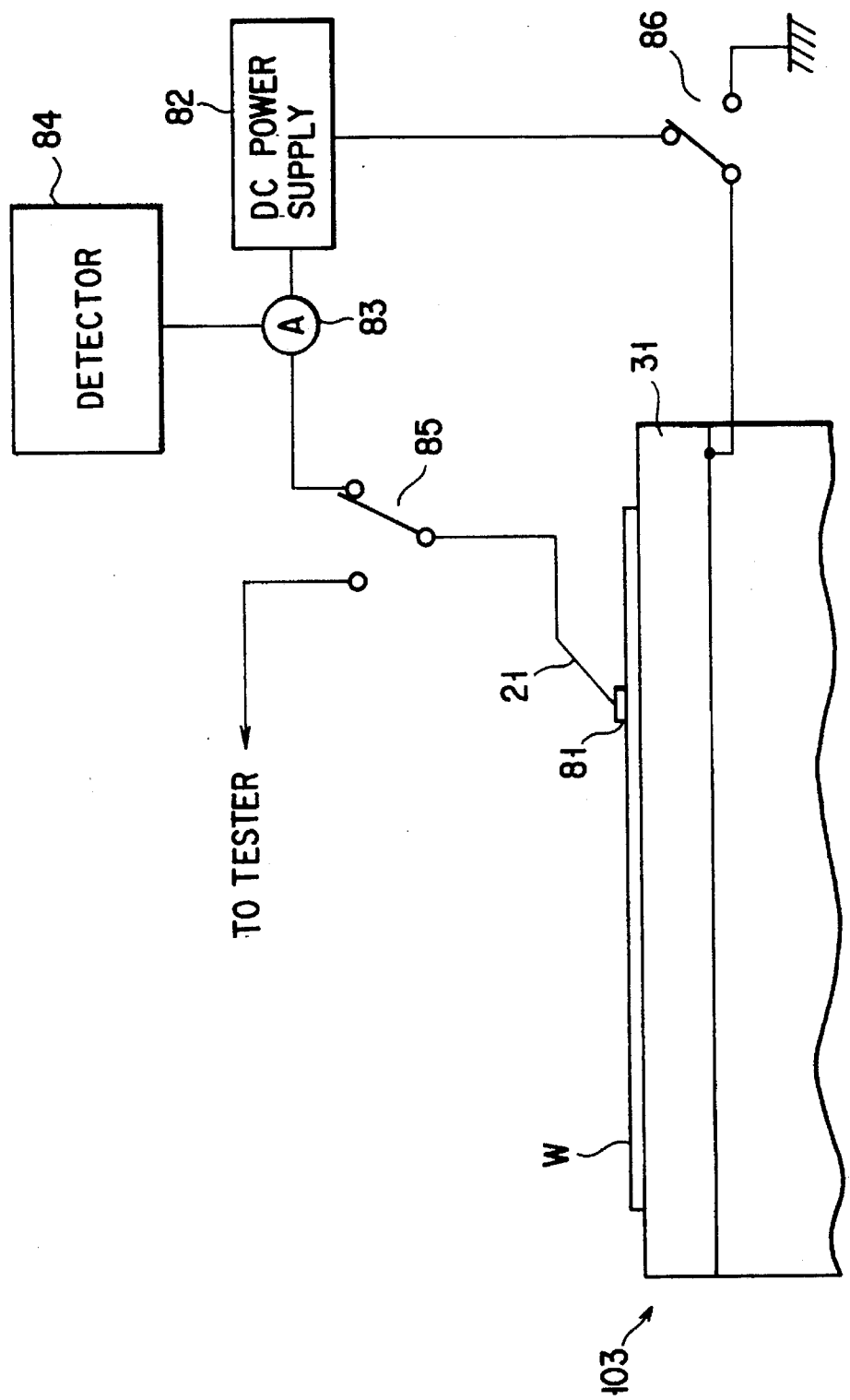
FIG. 9 is a diagram showing a circuit used for confirming contact between a probe and the electrode pad of an IC.

In the burn-in test, since the test is performed under electrically severe conditions, it is important to perform the test after confirming that the probes surely contact the pads of the IC chips in view of IC protection. For this purpose, it is preferable to confirm that corresponding actual probes contact the pads of all the ICs to be measured by using the circuit shown in FIG. 9. In FIG. 9, while the probe 21 contacts a pad 81, a closed circuit is formed by utilizing the diode characteristics of the IC, and the voltage of the closed circuit is measured, thereby confirming that the probe contacts the pad. More specifically, a DC power supply 82 is provided in the close circuit. A voltage of about, e.g., 0.5 V not damaging the wafer is applied by the DC power supply 82. The value of an ammeter 83 is detected by a detector 84, thereby confirming that the probe 21 contacts the pad 81. The same measurement is performed sequentially for the respective pads and probes by utilizing the relays, thereby confirming contact of all the pads and probes. A switch 85 causes a probe to contact either this contact confirming circuit or the tester. A switch 86 is switched to the ground side during the burn-in test.

This apparatus can automatically skip defective chips or wafers upon storage of a defective chip or wafer history so as to perform a continuous unmanned test for 24 hours. When an error is detected by this apparatus, a test, i.e., a burn-in test, must be performed again. In this apparatus, a total burn-in test time is counted by a tester. Therefore, even if the test is interrupted due to some reason, a stress application time can be managed to be a predetermined duration.

An operation performed during the burn-in test by the probe apparatus will be described. A semiconductor wafer W is placed on the wafer supporting table 103 by the wafer handling arm 107. The alignment of the probes 21 and the electrode pads on the wafer W in the X, Y, and θ directions is performed by observing the CRT camera 14 (see FIG. 1). Thereafter, the wafer supporting table 103 is moved upward to cause the probes 21 to contact the respective electrode pads of, e.g., 44 IC chips at a time. After contact between all the probes 21 and electrode pads is confirmed by the arrangement shown in FIG. 9, the switch 85 is switched to the tester side, and the burn-in test is performed.

In the burn-in test, the wafer w is heated to, e.g., 150° C. by the thermal stress means 30 comprising the heating and cooling mechanisms incorporated in the wafer supporting table 103, thereby applying a thermal stress to the IC chips. At the same time, an electrical stress is applied from the inspection circuit of the tester to the respective IC chips. Application of the electrical stress is performed by applying, by the power supply section 40, a voltage lower or higher than the power supply voltage determined by the specifications, applying a DC voltage stress by the voltage stress circuits 50A to 50C, or applying a pulse stress by the pulse stress circuits 50D and 50E, as described above.

The values of the current flowing in, e.g., the pins P1 to P9 of each IC chip are sequentially measured by the current measurement section 53 by using the relay circuit 52 (see FIG. 7), and whether the given IC is defective or not is determined based on the measurement result. The respective pins are subjected to measurement in a parallel manner.

In this manner, screening is performed while applying temperature and electrical stresses to the respective IC chips.

The channels 66-1 to 66-n are sequentially switched by the multiplexer 63 based on address signals sent from the address selection circuit 70. Then, the voltages (corresponding to the values of the current flowing in the current measuring resistors) across the current measuring resistors Rl to Rn are sequentially input to the differential amplifier 64. The output voltage of the differential amplifier 64 is compared with the reference voltage (preset current value) by the comparator 65. If the current flowing in the current measuring resistors Rl to Rn is equal to the preset value or less, the comparator 65 is kept OFF. If, e.g., application of the electrical and thermal stresses to the IC chip makes the internal defect appear and causes internal short circuiting, an overcurrent flows from the power supply section 40 to this IC chip. Then, the current exceeds the preset value. In this case, the comparator 65 is turned on. A predetermined voltage is generated, and as a result the power supply section 40 is turned off by the operation of the power supply section controller 61. At the same time, the output voltage from the comparator 65 and an address signal from the address selection circuit 70 are input to the relay controller 62 to open a corresponding relay in the manner as described above. Then, this IC chip becomes defective, and this IC chip is disconnected from the power supply section 40.

The output voltage of the differential amplifier 64 is input to the computer through the A/D converter 68, and the IC chip in which the overcurrent flows is stored in the computer. Thereafter, the power supply section 40 is turned on again to perform screening in the same manner. An IC chip is determined to be defective. An overcurrent flows in this IC chip from the power supply section 40. Then, this IC chip is disconnected from the power supply section 40 in the same manner as described above.

In this manner, according to the present invention, the burn-in test function is imparted to the probe apparatus. The probes 21 are caused to contact the electrode pads of the IC chips on the wafer W, thereby performing the burn-in test. Therefore, the test process is simple when compared to a case wherein the test is performed by mounting a packaged IC in the stress loader. When an IC chip is determined to be defective at this time point, since it is not packaged yet, it can be repaired if the defect is small. If this IC chip cannot be repaired, it will not be packaged, eliminating a wasteful process.

The current flowing from the power supply section 40 to the IC chip is monitored. If an overcurrent flows, the corresponding IC chip is disconnected from the power supply section 40. Hence, even if the burn-in test causes, e.g., short circuiting in an IC chip to make it defective, burn loss caused by the overcurrent can be prevented. Accordingly, other IC chips in the same wafer will not be burnt, and generation of particles can be prevented.

Since the current flowing to the IC chips is sequentially monitored by switching the channels by the multiplexer 63, the number of components and boards can be decreased when a large number of IC chips are to be measured. More specifically, if the multiplexer 63 is not provided, differential amplifiers, comparators, and A/D converters are required to correspond in number to the number of IC chips, leading to an increase in cost and the number of boards. If the multiplexer 63 is used, the problem of cost is solved. The number of multiplexers 63 need not be one. If the number of input terminals of the multiplexer 63 is smaller than the number of channels, a plurality of multiplexers 63 may be provided to cope with the small number of input terminals.

Figure 10:
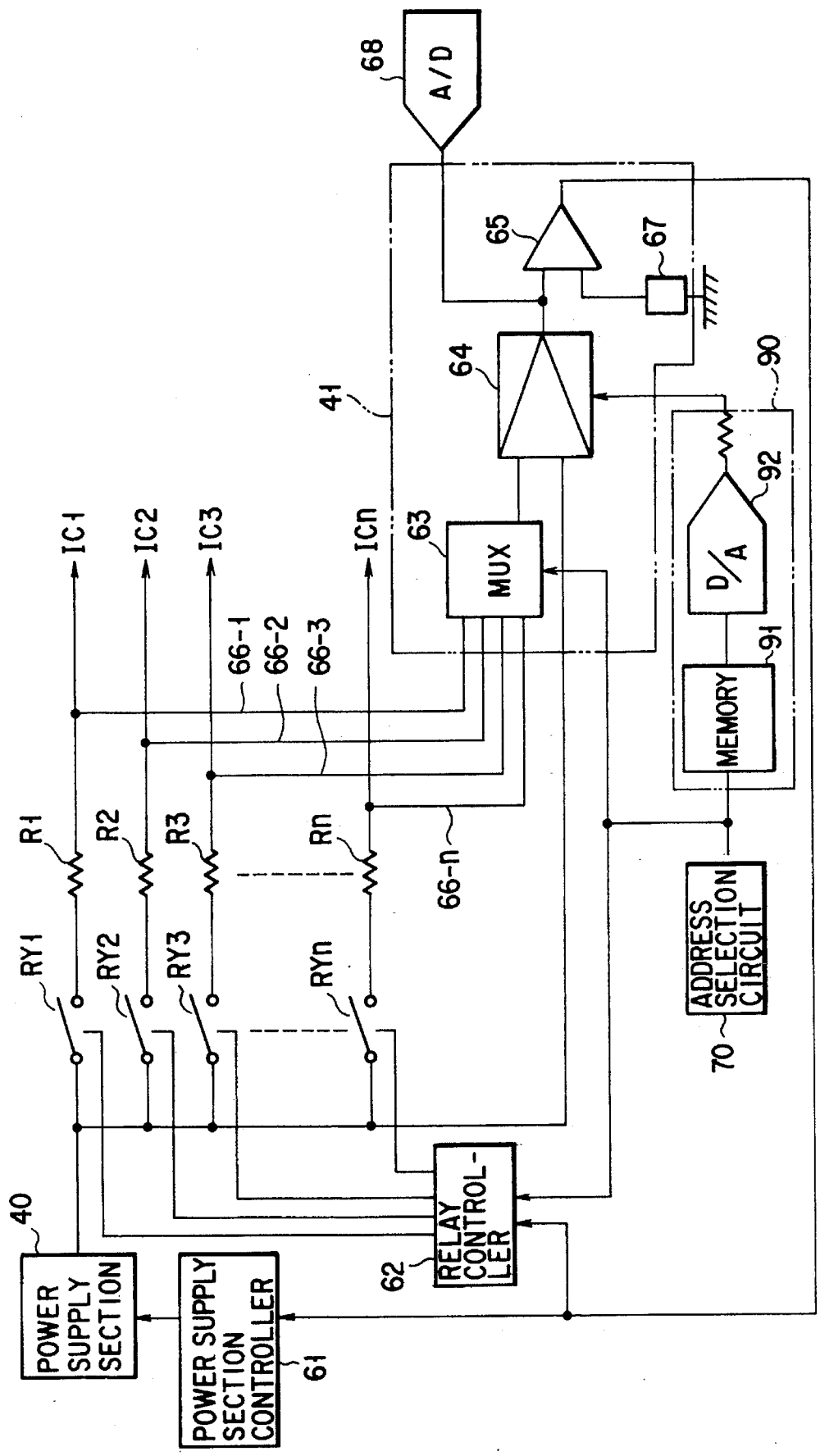
FIG. 10 is a circuit diagram showing the structure of another arrangement of the power supply monitor section.

A preferred arrangement for detecting the current flowing in the current detection resistors will be described with reference to FIG. 10. The object of this arrangement is to suppress a decrease in detection precision of the current detection resistance caused by variations in the specific resistance and wiring length of the components of respective current measuring resistors Rl to Rn and channels 66-1 to 66-n. More specifically, in this arrangement, the resistance across one to the other input terminal of a differential amplifier 64 through a current measuring resistor is obtained in advance for each channel, and a correction value is determined in accordance with the resistance. This correction value can be determined as, e.g., a difference from or ratio with respect to a reference resistance. The current measuring section of this arrangement has, in addition to the constituent elements shown in FIG. 8, a correcting means 90 having a memory 91 and a D/A converter 92. The memory 91 stores correction values. The D/A converter 92 reads, from the correction values in the memory 91, a correction value corresponding to the address (channel) selected by the address selection circuit, and corrects the offset voltage of the differential amplifier 64 by using the data of the correction value as an analog signal.

In this arrangement, the channels 66-1 to 66-n are sequentially switched by a multiplexer 63, and the terminal voltages of the current detection resistors Rl to Rn are sequentially input to the differential amplifier 64. At the same time, a correction value which is, e.g., a difference from the reference resistance and corresponding to the selected channel is read out from the memory 91 and supplied to the differential amplifier 64 as the offset voltage.

Regarding the respective current measuring resistors, resistors each having a low resistance, e.g., 0.1 Ω are used in order to eliminate voltage drop. Then, as the wirings are arranged, variations as large as, e.g., ±7% occur in the resistance across the current measuring resistors and the multiplexer 63. Therefore, it is significant to correct the variations for each channel in this manner. As a result, the differential amplifier 64 outputs a voltage corresponding to the current flowing in the current measuring resistors Rl to Rn, so that current measurement can be performed at high precision, and the IC chip can be reliably separated from the overcurrent flowing from a power supply section 40.

To correct the resistances for each channel, a correction value may be input to the input terminal of the differential amplifier 64, or may be added to the reference voltage of a comparator 65.

In this embodiment, the power supply section 40 is turned off simultaneously when an overcurrent is detected. However, in the present invention, the power supply section 40 need not necessarily be turned off, but the voltage may be decreased to a safe level. The present invention is not limited to an apparatus for measuring a plurality of IC chips simultaneously, but can similarly be applied to an apparatus for causing probes to contact IC chips separately and performing measurement separately.

When a test voltage is simultaneously applied to IC chips, sometimes the rush current is excessively large depending on the types of ICs to be subjected to the burn-in test, thereby making it difficult to perform the test. In this case, the ICs on the wafer that are to be measured may be divided into several groups, and the timing to apply a voltage is slightly shifted from one group to another in a hardware manner by using a delay circuit, thereby avoiding an excessively large rush current.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe apparatus having a burn-in test function, comprising:

an apparatus body;

probe card means, having a plurality of probes, for causing said plurality of probes to directly electrically contact a plurality of electrode pads of at least one semiconductor chip included in a semiconductor wafer before cutting into semiconductor chips;

means for measuring electrical characteristics of the at least one semiconductor chip of the semiconductor wafer;

thermal stress means for applying a thermal stress to the wafer;

electrical stress means for applying an electrical stress to a test target chip through corresponding probes of said probe card means; and measuring means for measuring an electrical parameter of the test target chip on the wafer to which a predetermined thermal and electrical stress is applied.

2. An apparatus according to claim 1, wherein said thermal stress means comprises a heating mechanism for heating the wafer.

3. An apparatus according to claim 2, wherein said thermal stress means further comprises a cooling mechanism for cooling the wafer.

4. An apparatus according to claim 3, further comprising wafer supporting means for supporting the wafer, and wherein said heating and cooling mechanisms are provided in said wafer supporting means.

5. An apparatus according to claim 1, wherein said electrical stress means comprises a voltage stress generating circuit and a pulse stress generating circuit.

6. An apparatus according to claim 1, wherein said electrical stress means comprises switching means for sequentially applying an electrical stress to a plurality of pads of the test target chip.

7. An apparatus according to claim 5, wherein said pulse stress generating circuit comprises a delay circuit for controlling a timing of a pulse to be applied to pads of the test target chip.

8. An apparatus according to claim 1, further comprising means for confirming contact between said plurality of probes and corresponding electrodes before the burn-in test.

9. An apparatus according to claim 1, wherein said thermal stress means and said electrical stress means apply a thermal stress and an electrical stress to a plurality of chips.

10. A probe apparatus having a burn-in test function, comprising:

an apparatus body;

probe card means, having a plurality of probes, for causing said plurality of probes to directly electrically contact a plurality of electrode pads of at least one semiconductor chip included in a semiconductor wafer before cutting into semiconductor chips;

means for measuring electrical characteristics of the at least one semiconductor chip of the semiconductor wafer;

thermal stress means for applying a thermal stress to the wafer;

electrical stress means for applying an electrical stress to a test target chip through corresponding probes of said probe card means;

power supply means for applying a power supply voltage to the test target chip;

measuring means for measuring an electrical parameter of the test target chip on the wafer to which a predetermined thermal and electrical stress is applied;

current monitor means for measuring a current flowing from said power supply means to the burn-in test target chip and outputting one of a current cutoff signal and a current decrease signal when a current measurement value exceeds a preset value; and current control means for one of cutting off and decreasing the current flowing in the test target chip by the current cutoff signal sent from said current monitor means.

11. An apparatus according to claim 10, wherein said current monitor means comprises current measuring resistors respectively provided to power supply lines between the power supply means and a target chip and a common current measuring section for receiving a voltage across said current measuring resistors and measuring a current flowing in said current measuring resistors.

12. An apparatus according to claim 11, wherein said common current measuring section comprises a channel switching section for sequentially outputting the voltages across said current measuring resistors through channels, and measures a current sent from said channel switching section.

13. An apparatus according to claim 11, wherein said current monitor means comprises correcting means for correcting a current measurement value of said common current measuring section.

14. An apparatus according to claim 13, wherein said correcting means comprises a memory for storing correction values respectively corresponding to said channels, reads a correction value corresponding to a channel selected by said channel switching section from said memory, and corrects a current of said common current measuring section based on a readout correction value.

15. An apparatus according to claim 10, wherein said thermal stress means comprises a heating mechanism for heating the wafer.

16. An apparatus according to claim 15, wherein said thermal stress means further comprises a cooling mechanism for cooling the wafer.

17. An apparatus according to claim 16, further comprising wafer supporting means for supporting the wafer, and wherein said heating and cooling mechanisms are provided in said wafer supporting means.

18. An apparatus according to claim 10, wherein said electrical stress means comprises a voltage stress generating section and a pulse stress generating section.

19. An apparatus according to claim 10, wherein said electrical stress means comprises switching means for sequentially applying an electrical stress to the test target chip.

20. An apparatus according to claim 18, wherein said pulse stress generating section comprises a delay circuit for controlling a timing of a pulse to be applied to pads of the test target chip.

21. An apparatus according to claim 10, further comprising means for confirming contact between said plurality of probes and corresponding electrodes before the burn-in test.

22. An apparatus according to claim 10, wherein said thermal stress means and said electrical stress means apply a thermal stress and an electrical stress to a plurality of chips.

* * * * *